US012417527B2

(12) United States Patent
Abidin et al.

(10) Patent No.: US 12,417,527 B2
(45) Date of Patent: Sep. 16, 2025

(54) APPARATUS, METHOD, AND PROGRAM PRODUCT FOR DETERMINING A FLARING EFFICIENCY ESTIMATE BASED ON CAPTURED IMAGE DATA, A SIMULATION MODEL, AND OPERATIONS DATA

(71) Applicant: HONEYWELL INTERNATIONAL INC., Charlotte, NC (US)

(72) Inventors: Shahrul Azman Bin Zainal Abidin, Kuala Lumpur (MY); Madhukar Madhavamurthy Gundappa, Bangalore (IN); Ramesh Murugan Natarajan, Bangalore (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 378 days.

(21) Appl. No.: 18/183,629

(22) Filed: Mar. 14, 2023

(65) Prior Publication Data
US 2024/0202902 A1   Jun. 20, 2024

(30) Foreign Application Priority Data
Dec. 20, 2022   (IN) .............................. 202211073866

(51) Int. Cl.
| | |
|---|---|
| *G06T 7/00* | (2017.01) |
| *G06T 7/50* | (2017.01) |
| *G06T 7/70* | (2017.01) |
| *G06T 7/90* | (2017.01) |

(Continued)

(52) U.S. Cl.
CPC .............. *G06T 7/0004* (2013.01); *G06T 7/50* (2017.01); *G06T 7/70* (2017.01); *G06T 7/90* (2017.01);

(Continued)

(58) Field of Classification Search
CPC .............. G06T 7/0004–001; G06T 7/50; G06T 7/70–77; G06T 7/90; G06T 2207/20081;

(Continued)

(56) References Cited

U.S. PATENT DOCUMENTS

| | | | |
|---|---|---|---|
| 7,876,229 B2 * | 1/2011 | Rao .................... | G06F 18/2411 250/554 |
| 11,248,963 B2 * | 2/2022 | Kraus .................. | G01J 5/0014 |

(Continued)

FOREIGN PATENT DOCUMENTS

| | | | | |
|---|---|---|---|---|
| EP | 3748444 A1 * | 12/2020 | ........... | G05B 13/027 |
| WO | WO-2008116037 A1 * | 9/2008 | .............. | F23G 5/50 |

(Continued)

*Primary Examiner* — Scott A Rogers
(74) *Attorney, Agent, or Firm* — ALSTON & BIRD LLP

(57) ABSTRACT

Systems, apparatuses, methods, and computer program products for determining flaring efficiency based on captured image data and operations data are provided herein. For example, a computer-implemented method for determining flaring efficiency may include receiving operations data representing operations of a plant. The computer-implemented method may include generating a simulation model of the plant based at least in part on the operations data. The computer-implemented method may include applying the simulation model of the plant to determine a first flaring efficiency estimate. The computer-implemented method may include receiving captured image data of a flare flame associated with the plant. The computer-implemented method may include analyzing the captured image data to determine a second flaring efficiency estimate. The computer-implemented method may include generating a flaring efficiency estimate based on at least one of the first flaring efficiency estimate and the second flaring efficiency estimate.

20 Claims, 5 Drawing Sheets

(51) Int. Cl.
*G06V 10/70* (2022.01)
*F23G 7/08* (2006.01)

(52) U.S. Cl.
CPC .............. *G06V 10/70* (2022.01); *F23G 7/085* (2013.01); *F23N 2223/40* (2020.01); *F23N 2229/20* (2020.01); *G06T 2207/20081* (2013.01); *G06T 2207/30108* (2013.01); *G06V 2201/06* (2022.01)

(58) Field of Classification Search
CPC .......... G06T 2207/30108; G06F 30/20; G06F 30/27; G06V 10/46; G06V 10/56; G06V 20/194; G06V 20/46; G06V 2201/06; F23G 7/08; F23G 7/085; F23N 2229/08; F23N 2229/20; F23N 2223/40; F23N 2241/12
See application file for complete search history.

(56) References Cited

U.S. PATENT DOCUMENTS

| 11,927,944 | B2* | 3/2024 | Gurajapu | G06N 3/045 |
| 2011/0085030 | A1* | 4/2011 | Poe | F23G 7/085 |
| | | | | 382/103 |
| 2023/0272910 | A1* | 8/2023 | Goyal | G06T 7/20 |
| | | | | 382/107 |
| 2023/0366543 | A1* | 11/2023 | Hay | F23G 7/085 |
| 2024/0161495 | A1* | 5/2024 | Gomez | G06V 10/56 |
| 2024/0219023 | A1* | 7/2024 | Gey | F23N 1/082 |

FOREIGN PATENT DOCUMENTS

| WO | WO-2020247664 A1 * | 12/2020 | ............. F23G 7/085 |
| WO | WO-2024057051 A1 * | 3/2024 | ............. F23G 5/50 |

* cited by examiner

APPARATUS, METHOD, AND PROGRAM PRODUCT FOR DETERMINING A FLARING EFFICIENCY ESTIMATE BASED ON CAPTURED IMAGE DATA, A SIMULATION MODEL, AND OPERATIONS DATA

TECHNOLOGICAL FIELD

Embodiments of the present disclosure relate generally to systems, apparatuses, methods, and computer program products for determining a flaring efficiency estimate based on captured image data and operations data.

BACKGROUND

Applicant has identified many technical challenges and difficulties associated with systems, apparatuses, methods, and computer program products for determining a flaring efficiency estimate based on captured image data and operations data. Through applied effort, ingenuity, and innovation, Applicant has solved problems related systems, apparatuses, methods, and computer program products for determining a flaring efficiency estimate based on captured image data and operations data by developing solutions embodied in the present disclosure, which are described in detail below.

BRIEF SUMMARY

Various embodiments described herein relate to systems, apparatuses, methods, and computer program products for determining a flaring efficiency estimate based on captured image data and operations data.

In accordance with one aspect of the disclosure, a computer-implemented method for determining a flaring efficiency estimate is provided. In some embodiments, the computer-implemented method may include receiving operations data representing operations of a plant. In some embodiments, the computer-implemented method may include generating a simulation model of the plant based at least in part on the operations data. In some embodiments, the computer-implemented method may include applying the simulation model of the plant to determine a first flaring efficiency estimate. In some embodiments, the computer-implemented method may include receiving captured image data of a flare flame associated with the plant. In some embodiments, the computer-implemented method may include analyzing the captured image data to determine a second flaring efficiency estimate. In some embodiments, the computer-implemented method may include determining the flaring efficiency estimate based on at least one of the first flaring efficiency estimate and the second flaring efficiency estimate.

In some embodiments, the operations data comprises one or more of plant component identifiers, plant production capacity data, plant efficiency data, plant process data, flow rate data, temperature data, pressure data, volume data, venting data, oxygen input data, density data, material composition data, and weather data.

In some embodiments, the operations data representing operations of the plant is received in real-time.

In some embodiments, the simulation model comprises one or more well components, fracking components, heater components, pump components, storage tank components, flash venting components, compressor components, cooler components, sensor components, and flare components.

In some embodiments, the flaring efficiency estimate is an average of the first flaring efficiency estimate and the second flaring efficiency estimate.

In some embodiments, the flaring efficiency estimate is equal to the first flaring efficiency estimate.

In some embodiments, the flaring efficiency estimate is equal to the first flaring efficiency estimate when the operations data indicates that the second flaring efficiency estimate is inaccurate.

In some embodiments, analyzing the captured image data includes applying an image recognition model to analyze the captured image data to determine one or more of a flame tilt, a flame color, and a flame shape.

In some embodiments, the second flaring efficiency estimate is determined based at least in part on one or more of the flame tilt, the flame color, and the flame shape.

In some embodiments, the image recognition model is a machine learning model trained on a historical captured image dataset and a historical operations data dataset.

In accordance with another aspect of the disclosure, an apparatus for determining a flaring efficiency estimate is provided. In some embodiments, the apparatus includes at least one processor and at least one memory coupled to the processor. In some embodiments, the processor may be configured to receive operations data representing operations of a plant. In some embodiments, the processor may be configured to generate a simulation model of the plant based at least in part on the operations data. In some embodiments, the processor may be configured to apply the simulation model of the plant to determine a first flaring efficiency estimate. In some embodiments, the processor may be configured to receive captured image data of a flare flame associated with the plant. In some embodiments, the processor may be configured to analyze the captured image data to determine a second flaring efficiency estimate. In some embodiments, the processor may be configured to determine the flaring efficiency estimate based on at least one of the first flaring efficiency estimate and the second flaring efficiency estimate.

In some embodiments, the operations data comprises one or more of plant component identifiers, plant production capacity data, plant efficiency data, plant process data, flow rate data, temperature data, pressure data, volume data, venting data, oxygen input data, density data, material composition data, and weather data.

In some embodiments, the operations data representing operations of the plant is received in real-time.

In some embodiments, the simulation model comprises one or more well components, fracking components, heater components, pump components, storage tank components, flash venting components, compressor components, cooler components, sensor components, and flare components.

In some embodiments, the flaring efficiency estimate is an average of the first flaring efficiency estimate and the second flaring efficiency estimate.

In some embodiments, the flaring efficiency estimate is equal to the first flaring efficiency estimate.

In some embodiments, the flaring efficiency estimate is equal to the first flaring efficiency estimate when the operations data indicates that the second flaring efficiency estimate is inaccurate.

In some embodiments, analyzing the captured image data includes applying an image recognition model to analyze the captured image data to determine one or more of a flame tilt, a flame color, and a flame shape.

In some embodiments, the second flaring efficiency estimate is determined based at least in part on one or more of the flame tilt, the flame color, and the flame shape.

In some embodiments, the image recognition model is a machine learning model trained on a historical captured image dataset and a historical operations data dataset.

In accordance with another aspect of the disclosure, a non-transitory computer-readable storage medium for determining a flaring efficiency estimates is provided. In some embodiments, the non-transitory computer-readable storage medium may include computer program code for execution by one or more processors of a device. In some embodiments, the computer program code configured to, when executed by the one or more processors, cause the device to receive operations data representing operations of a plant. In some embodiments, the computer program code configured to, when executed by the one or more processors, cause the device to generate a simulation model of the plant based at least in part on the operations data. In some embodiments, the computer program code configured to, when executed by the one or more processors, cause the device to apply the simulation model of the plant to determine a first flaring efficiency estimate. In some embodiments, the computer program code configured to, when executed by the one or more processors, cause the device to receive captured image data of a flare flame associated with the plant. In some embodiments, the computer program code configured to, when executed by the one or more processors, cause the device to analyze the captured image data to determine a second flaring efficiency estimate. In some embodiments, the computer program code configured to, when executed by the one or more processors, cause the device to determine the flaring efficiency estimate based on at least one of the first flaring efficiency estimate and the second flaring efficiency estimate.

In some embodiments, the operations data comprises one or more of plant component identifiers, plant production capacity data, plant efficiency data, plant process data, flow rate data, temperature data, pressure data, volume data, venting data, oxygen input data, density data, material composition data, and weather data.

In some embodiments, the operations data representing operations of the plant is received in real-time.

In some embodiments, the simulation model comprises one or more well components, fracking components, heater components, pump components, storage tank components, flash venting components, compressor components, cooler components, sensor components, and flare components.

In some embodiments, the flaring efficiency estimate is an average of the first flaring efficiency estimate and the second flaring efficiency estimate.

In some embodiments, the flaring efficiency estimate is equal to the first flaring efficiency estimate.

In some embodiments, the flaring efficiency estimate is equal to the first flaring efficiency estimate when the operations data indicates that the second flaring efficiency estimate is inaccurate.

In some embodiments, analyzing the captured image data includes applying an image recognition model to analyze the captured image data to determine one or more of a flame tilt, a flame color, and a flame shape.

In some embodiments, the second flaring efficiency estimate is determined based at least in part on one or more of the flame tilt, the flame color, and the flame shape.

In some embodiments, the image recognition model is a machine learning model trained on a historical captured image dataset and a historical operations data dataset.

BRIEF SUMMARY OF THE DRAWINGS

Figure 1:
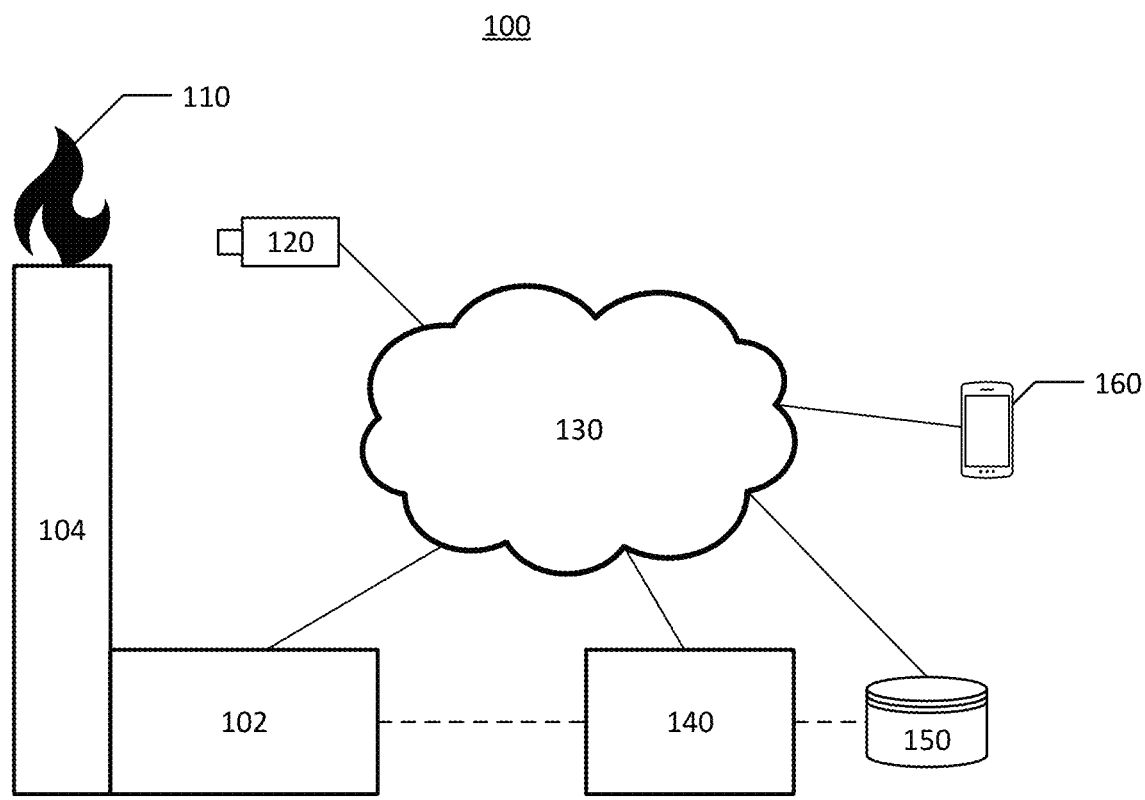
Figure 2:
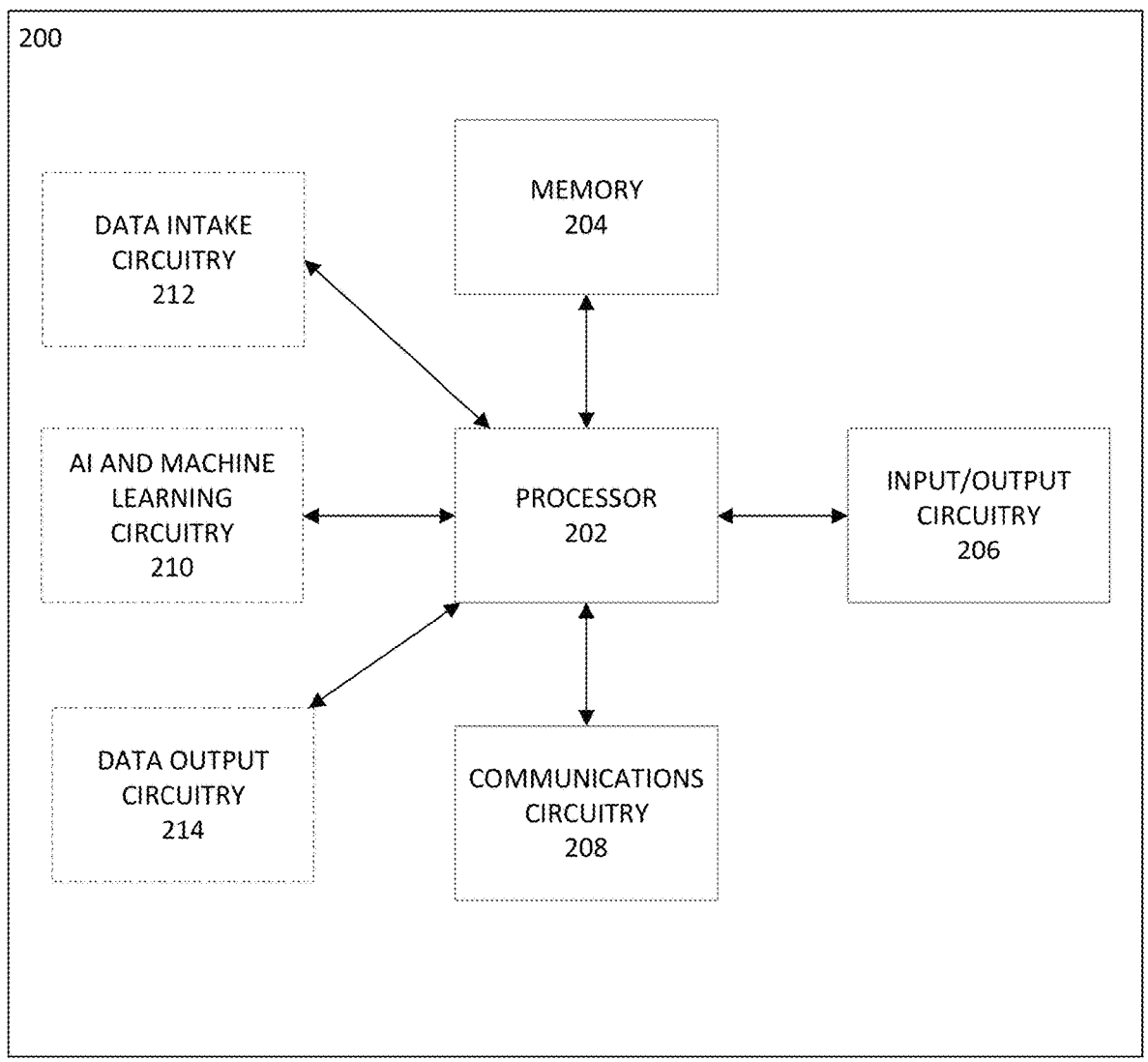
Figure 3:
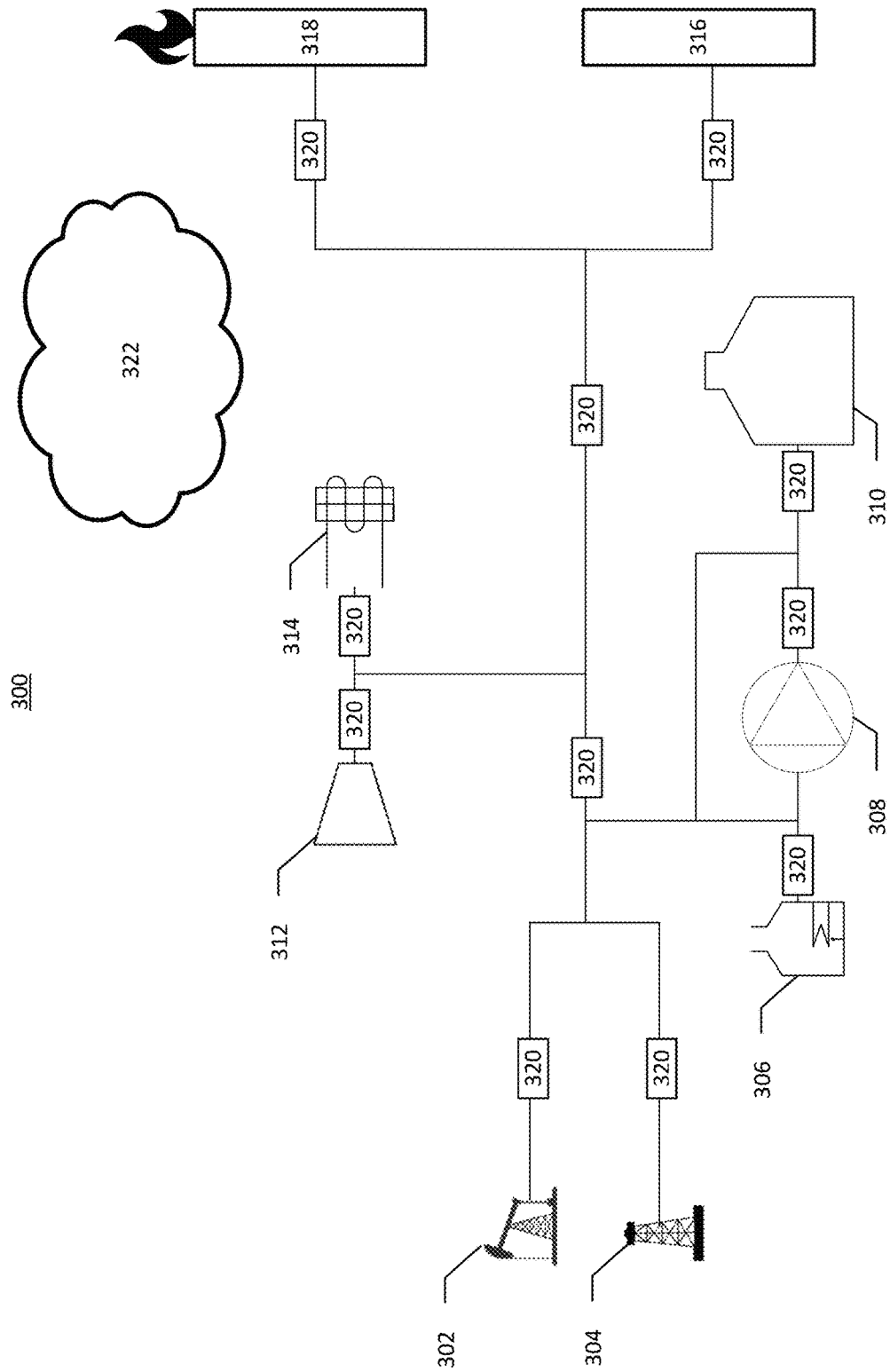

Having thus described certain example embodiments of the present disclosure in general terms, reference will now be made to the accompanying drawings, which are not necessarily drawn to scale, and wherein:

FIG. 1 illustrates an exemplary block diagram of an environment in which embodiments of the present disclosure may operate;

FIG. 2 illustrates an exemplary block diagram of an example apparatus that may be specially configured in accordance with an example embodiment of the present disclosure;

FIG. 3 illustrates an exemplary simulation model in accordance with an example embodiment of the present disclosure.

Figure 4:
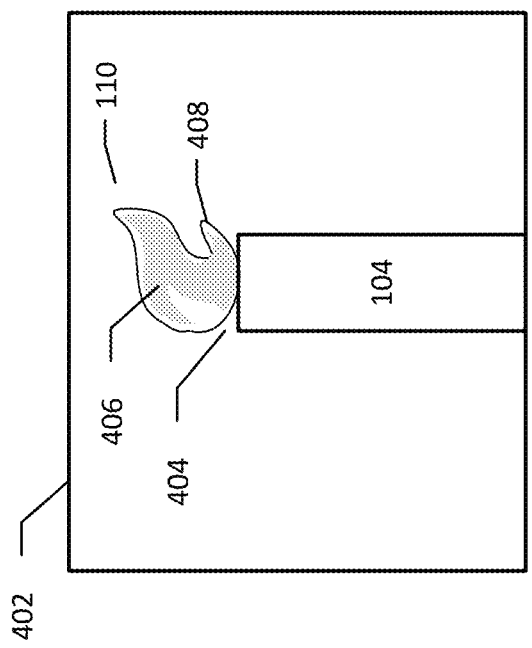
Figure 5:
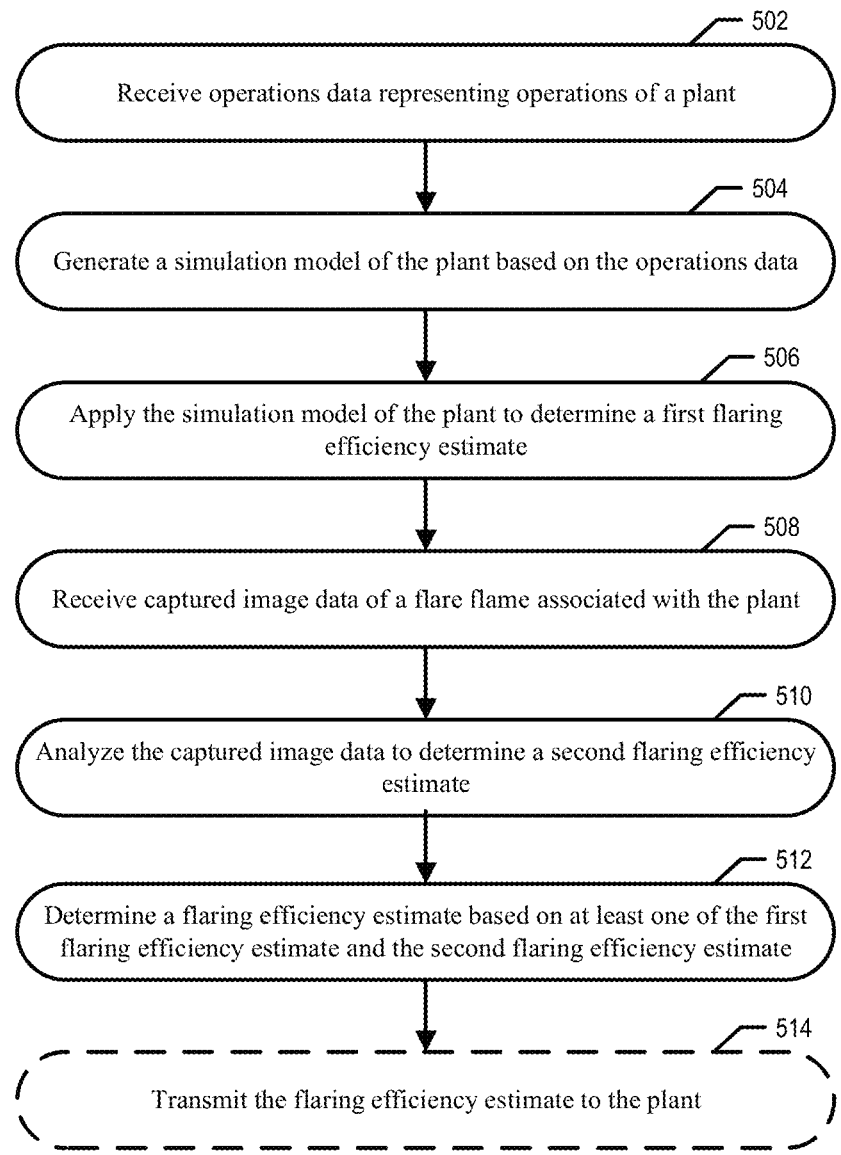

FIG. 4 illustrates an exemplary flame image associated with captured image data in accordance with an example embodiment of the present disclosure; and FIG. 5 illustrates a flowchart for determining a flaring efficiency estimate based on captured image data and operations data in accordance with an example embodiment of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, communication circuitry, input/output circuitry, and the like. In some embodiments, other elements may provide or supplement the functionality of particular circuitry. Alternatively or additionally, in some embodiments, other elements of a system and/or apparatus described herein may provide or supplement the functionality of another particular set of circuitry. For example, a processor may provide processing functionality to any of the sets of circuitry, a memory may provide storage functionality to any of the sets of circuitry, communications circuitry may provide network interface functionality to any of the sets of circuitry, and/or the like.

Overview

Example embodiments disclosed herein address technical problems associated with systems, apparatuses, methods, and computer program products for determining a flaring efficiency estimate based on captured image data (e.g., captured image data of a flare flame associated with a plant) and operations data (e.g., operations data representing operations of a plant). As would be understood by one skilled in the field to which this disclosure pertains, there are numerous example scenarios in which a user may use systems, apparatuses, methods, and computer program products for determining a flaring efficiency estimate based on captured image data and operations data.

In many plants (e.g., hydrocarbon processing plants, refinery plants, drilling plants, fracking plants, etc.), it is necessary to dispose of gases (e.g., greenhouse gases) produced in a process performed by the plant. One approach to disposing of the gases produced in the process performed by a plant is to release the gases directly into the atmosphere (e.g., venting the gases). However, releasing the gases directly into the atmosphere can cause severe environmental impacts. Another approach used by plants for disposing of gases produced in the industrial process is flaring, in which the gases (e.g., flammable gases) are ignited by an ignition source, such as a pilot flame, in a flaring stack when the gases pass by the ignition source. The flaring of hydrocarbons in the gases will include lower emissions than the venting of the same gases because flaring converts the hydrocarbons in the gas(es) to CO2 and water while venting does not change the composition of the gas to water.

In many examples, it is necessary for a plant to accurately track the amount of gas that the plant is releasing into the atmosphere (e.g., to ensure the plant meets sustainability regulations). Accordingly, when a plant is disposing of gases produced in a process using flaring, it is necessary for the plant to determine a flaring efficiency (e.g., a flaring efficiency estimate). A flaring efficiency may be a measurement of the amount of the gas that is combusted through flaring versus the amount of the gas that is released into the atmosphere (e.g., the gas that the ignition source fails to combust when the gas is exiting the plant). Example solutions for determining flaring efficiency include, for example, assuming a particular flaring efficiency based on industry standards (e.g., assuming that the flaring efficiency is approximately 98 percent). However, the inventors have determined that the flaring efficiency may be affected by a variety of factors (e.g., weather, plant design, plant operations, etc.), such that, in many examples, the flaring efficiency of a plant may regularly fluctuate. (e.g., be more efficient and/or less efficient than the assumed flaring efficiency based on industry standards). As a result, assuming a flaring based on industry standards results in the plant being unable to accurately track the amount of gas that the plant is releasing into the atmosphere. Accordingly, there is a need for systems, apparatuses, methods, and computer program products for accurately (e.g., not based on an assumption according to industry standards) determining a flaring efficiency estimate.

Thus, to address these and/or other issues related to determining flaring efficiency, example, systems, apparatus, methods, and computer program products for determining a flaring efficiency estimate are disclosed herein. For example, various embodiments in this disclosure described in greater detail below may include receiving operations data representing operations of a plant. For example, in various embodiments the operations data may include one or more of plant component identifiers, plant production capacity data, plant efficiency data, plant process data, flow rate data, temperature data, pressure data, volume data, venting data, oxygen input data, material composition data, and weather data. In some examples, various embodiments include generating a simulation model of the plant based on the operations data. In some examples, the simulation model may include one or more well components, fracking components, heater components, pump components, storage tank components, flash venting components, compressor components, cooler components, sensor components, and flare components. In some examples, various embodiments include applying the simulation model of the plant to determine a first flaring efficiency estimate. In some examples, various embodiments receiving captured image data of a flare flame associated with the plant. In some examples, various embodiments analyzing the captured image data to determine a second flaring efficiency estimate. In some examples, various embodiments generating a flaring efficiency estimate based on at least one of the first flaring efficiency estimate and the second flaring efficiency estimate. Accordingly, the systems apparatuses, methods, and computer program products disclosed herein are able to determine an accurate flaring efficiency estimate based on captured image data and/or operations data.

Example Systems and Apparatuses

Embodiments of the present disclosure herein include systems, apparatuses, methods, and computer program products configured for and to perform one or more operations for determining a flaring efficiency estimate based on captured image data and operations data. It should be readily appreciated that the embodiments of the apparatus, systems, methods, and computer program product described herein may be configured in various additional and alternative manners in addition to those expressly described herein.

FIG. 1 illustrates an exemplary block diagram of an environment 100 in which embodiments of the present disclosure may operate. Specifically, FIG. 1 illustrates a plant 102 that may be associated with a flare stack 104 ("stack 104"). In some embodiments, the stack 104 may be a component or unit of the plant 102. The stack 104 may be used to flare and/or vent one or more gases. These gases may include, but are not limited to, greenhouse gases. Flaring of gases may generate a flame 110 (e.g., a flare flame). In some embodiments, the flame 110 may be a component or unit of the plant 102. The flame 110 of a stack 104 may be observed, measured, analyzed by, and/or the like by one or more cameras 120 in accordance with operations and/or functions described herein. In some embodiments, the one or more cameras 120 may be configured to generate captured image data of the flame 110. The one or more cameras 120 may generate and/or transmit the captured image data across a network 130 to an operations processing system 140. The operations processing system 140 may be electronically and/or communicatively coupled to one or more plant(s), for example to plant 102, one or more databases 150, and/or one or more user devices 160. In some embodiments, the plant 102 embodies or includes a different type of processing plant, and/or does not include the flare stack 104. For example, in some embodiments, the plant 102 includes any number of processing units that each perform different tasks for producing a final product (e.g., an extracted, a refined, a blended, a constructed, or an otherwise combined product) from one or more input ingredients.

The plant 102 may, for example, be a processing plant that receives and processes ingredients as inputs to create a final product, such as a hydrocarbon processing plant, a refinery plant, a drilling plant, and/or a fracking plant. The plant 102 may generate gasses (e.g., waste gases). In various embodiments, gasses (e.g., waste gases) may be released to atmosphere, such as through a stack 104. Additionally or alternatively, gases may be flared when being released to atmosphere. Additionally, or alternatively, flaring and venting of gases may occur at locations other than a stack 104. For example, smaller quantities of gases at other locations may be released or may leak into the atmosphere. In some embodiments, locations other than a stack 104 where gases may be vented and/or flared may include a vent (e.g., a safety release valve).

The plant 102 in some embodiments includes any number of individual processing units. The processing units may each embody an asset of the plant 102 that performs a particular function during operation of the plant 102. For example in the example context of a hydrocarbon processing plant, a refinery plant, a drilling plant, and/or a fracking plant embodying the plant 102, the processing units may include one or more well units, fracking units, crude processing units, hydrotreating units, isomerization units, vapor recovery units, catalytic cracking units, aromatics reduction units, visbreaker units, storage tank units, blender units, pump units, flash venting units, compressor units, cooler units (e.g., air cooler units), sensor units, flare units (e.g., the stack 104), and/or the like that perform a particular operation for transforming, storing, releasing, and/or otherwise handling one or more input ingredient(s) (e.g., hydrocarbons, gases, etc.). In some embodiments, the one or more sensor units may include one or more flow rate sensors, temperature sensors, pressure sensors, humidity sensors, image sensors, density sensors, material composition sensors (e.g., spectrometers, spectrophotometers, etc.), and/or the like.

In some embodiments, each individual unit embodying a component of the plant 102 is associated with a determinable location. The determinable location of a particular unit in some embodiments represents an absolute position (e.g., GPS coordinates, latitude, and longitude locations, and/or the like) or a relative position (e.g., a point representation of the location of a unit from a local origin point corresponding to the plant 102). In some embodiments, a unit includes or otherwise is associated with a location sensor and/or software-driven location services that provide the location data representing the location corresponding to that unit. In other embodiments the location of a unit is stored and/or otherwise predetermined within a software environment, provided by a user and/or otherwise determinable to one or more systems, for example including the operations processing system 140.

Additionally or alternatively, in some embodiments, the plant 102 itself is associated with a determinable location. The determinable location of the plant 102 in some embodiments represents an absolute position (e.g., GPS coordinates, latitude and longitude locations, an address, and/or the like) or a relative position of the plant 102 (e.g., an identifier representing the location of the plant 102 as compared to one or more other plants, an enterprise headquarters, or general description in the world for example based at least in part on continent, state, or other definable region). In some embodiments, the plant 102 includes or otherwise is associated with a location sensor and/or software-driven location services that provide the location data corresponding to the plant 102. In other embodiments, the location of the plant 102 is stored and/or otherwise determinable to one or more systems, for example including the operations processing system 140.

In some embodiments, the flame 110 may be associated with flaring. Flaring involves the igniting and burning of concentrations of flammable gases. A gas may be comprised of a plurality of concentrations of individual gases, and some of these concentrations of individual gases may be flammable. Alternatively, a gas may be comprised of a concentration of an individual gas, which may or may not be flammable. In some embodiments, a gas may contain greenhouse gases, such as hydrocarbons. The hydrocarbons may be ignited by an ignition source, such as a pilot flame, when the gas passes by the ignition source. In some embodiments, oxygen may be mixed with the hydrocarbons before the gas passes by the ignition source and/or simultaneously as the gas passes by the ignition source. In some embodiments, the oxygen may at least partially facilitate the burning of the gas. The ignited gas(es) may be referred to as flares, and this process may be referred to as flaring. In various embodiments, flaring may occur at the flaring stack 104, which may be at a high level of elevation from one or more other components of a plant 102, process area, piping, and the like associated with a site.

In some embodiments, the plant 102 (e.g., the stack 104 and the flame 110) may be associated with a flaring efficiency (e.g., a flaring efficiency estimate). A flaring efficiency may be a measurement of the amount of the gas that is combusted (e.g., burned) through flaring versus the amount of the gas that is released into the atmosphere (e.g., the gas that the ignition source fails to combust when the gas is exiting the plant 102 through the stack 104).

In embodiments with gases comprising hydrocarbons, the flaring of hydrocarbons will include lower emissions than the venting of the same gas(es). This is because flaring converts the hydrocarbons in the gas(es) to CO2 and water while venting does not change the composition of the waste gas to water. Thus the flaring may reduce the emissions of hydrocarbons into the atmosphere. In contrast to flaring, venting does not use combustion and, instead, is a direct release of gas(es) to the atmosphere. While FIG. 1 illustrates a flame 110, it will also be appreciated that by removing or omitting an ignition source, such as a pilot flame, gas(es) may be vented without flaring.

The one or more cameras 120 may detect, measure, capture, and/or analyze data (e.g., captured image data) associated with operation of one or more plant(s), for example the plant 102. In one such example context, the one or more cameras 120 detect, measure, and/or analyze a flame 110 and/or a gas emission, for example associated with a flaring and/or a venting. For example, the one or more cameras 120 may be configured to capture images and/or video in one or more spectrums of light. As another example, the one or more cameras 120 may be configured to capture images and/or video in the visible spectrum. Additionally or alternatively, the one or more cameras 120 may be configured to capture images and/or video in the infrared spectrum.

In some embodiments, the one or more cameras 120 may be configured to perform or execute one or more operations and/or functions with determining a type, quantity, and/or volume of gas flared and/or emitted. For example, a camera may capture both visible light and infrared light to generate images and/or video of flaring. Based on these images and/or video of flaring, the camera may determine a type of gas being in a flame 110 as well as a volume of gas flared. In another example with a gas emission that is vented and not flared, a camera may capture both visible light and infrared light to generate images and/or video of venting. Based on these images and/or video of venting, the camera may determine a type of gas being in a flame 110 as well as a volume of gas flared. In various embodiments, the one or more cameras 120 may generate captured image data (e.g., a camera generating images and/or video) and transmit the captured image data over a network 130.

The network 130 may be embodied in any of a myriad of network configurations. In some embodiments, the network 130 may be a public network (e.g., the Internet). In some embodiments, the network 130 may be a private network (e.g., an internal localized, or closed-off network between particular devices). In some other embodiments, the network 130 may be a hybrid network (e.g., a network enabling internal communications between particular connected devices and external communications with other devices). In various embodiments, the network 130 may include one or more base station(s), relay(s), router(s), switch(es), cell tower(s), communications cable(s), routing station(s), and/or the like. In various embodiments, components of the environment 100 may be communicatively coupled to transmit data to and/or receive data from one another over the network 130. Such configuration(s) include, without limitation, a wired or wireless Personal Area Network (PAN), Local Area Network (LAN), Metropolitan Area Network (MAN), Wide Area Network (WAN), and/or the like.

The operations processing system 140 may be located remotely or in proximity of a particular plant, for example the plant 102. In this regard, in some embodiments, the operations processing system 140 may be located remotely or in proximity to the emissions sources, such as flame 110. In some embodiments, the operations processing system 140 is configured via hardware, software, firmware, and/or a combination thereof, to perform data intake of one or more types of data associated with one or more plant(s), for example the plant 102. Additionally or alternatively, in some embodiments, the operations processing system 140 is configured via hardware, software, firmware, and/or a combination thereof, to generate and/or transmit command(s) that control, adjust, or otherwise impact operations of a particular plant or specific component(s) thereof, for example for controlling one or more operations of the plant 102. Additionally or alternatively still, in some embodiments, the operations processing system 140 is configured via hardware, software, firmware, and/or a combination thereof, to perform data reporting and/or other data output process(es) associated with monitoring or otherwise analyzing operations of one or more processing plant(s), for example for generating and/or outputting report(s) corresponding to the operations performed via the plant 102. For example, in various embodiments, the operations processing system 140 may be configured to execute and/or perform one or more operations and/or functions described herein.

The one or more databases 150 may be configured to receive, store, and/or transmit data. In some embodiments, the one or more databases 150 may be associated with captured image data received from the one or more cameras 120. Additionally or alternatively, the one or more databases 150 may be associated with operations data received from the plant 102, such as from the one or more sensor units of the plant 102. In some embodiments, the one or more databases 150 may be associated with captured image data received from the one or more cameras 120 in real-time. Additionally or alternatively, the one or more databases 150 may be associated with operations data received from the plant 102 in real-time, such as from the one or more sensor units of the plant 102. In some embodiments, the one or more databases 150 may be associated with historical captured image data received from the one or more cameras 120. In this regard, the one or more databases 150 may include one or more historical captured image datasets. Additionally or alternatively, the one or more databases 150 may be associated with historical operations data received from the plant 102, such as from the one or more sensor units of the plant 102. In this regard, the one or more databases 150 may include one or more historical operations data datasets. Additionally or alternatively, in some embodiments the one or more databases 150 store user inputted data associated with operations of one or more plant(s). In some embodiments, the one or more databases 150 store data associated with multiple individual plant(s), for example multiple plants associated with the same enterprise entity but located in different geographic locations across the world.

The one or more user devices 160 may be associated with users of the operations processing system 140. In various embodiments, the operations processing system 140 may generate and/or transmit a message, alert, or indication to a user via a user device 160. Additionally, or alternatively, a user device 160 may be utilized by a user to remotely access an operations processing system 140. This may be by, for example, an application operating on the user device 160. A user may access the operations processing system 140 remotely, including one or more visualizations, reports, and/or real-time displays.

Additionally, while FIG. 1 illustrates certain components as separate, standalone entities communicating over the network 130, various embodiments are not limited to this configuration. In other embodiments, one or more components may be directly connected and/or share hardware or the like. For example, in some embodiments, the operations processing system 140 may include one or more databases 150, which may collectively be located in or at the plant 102.

FIG. 2 illustrates an exemplary block diagram of an example apparatus that may be specially configured in accordance with an example embodiment of the present disclosure. Specifically, FIG. 2 depicts an example computing apparatus 200 ("apparatus 200") specially configured in accordance with at least some example embodiments of the present disclosure. Examples of an apparatus 200 may include, but is not limited to, the one or more cameras 120, an operations processing system 140, a database 150, and/or a user device 160. The apparatus 200 includes processor 202, memory 204, input/output circuitry 206, communications circuitry 208, and/or optional artificial intelligence ("AI") and machine learning circuitry 210. In some embodiments, the apparatus 200 is configured to execute and perform the operations described herein.

Although components are described with respect to functional limitations, it should be understood that the particular implementations necessarily include the use of particular computing hardware. It should also be understood that in some embodiments certain of the components described herein include similar or common hardware. For example, in some embodiments two sets of circuitry both leverage use of the same processor(s), memory(ies), circuitry(ies), and/or the like to perform their associated functions such that duplicate hardware is not required for each set of circuitry.

In various embodiments, such as computing apparatus 200 of an operations processing system 140 or of a user device 160 may refer to, for example, one or more computers, computing entities, desktop computers, mobile phones, tablets, phablets, notebooks, laptops, distributed systems, servers, or the like, and/or any combination of devices or entities adapted to perform the functions, operations, and/or processes described herein. Such functions, operations, and/or processes may include, for example, transmitting, receiving, operating on, processing, displaying, storing, determining, creating/generating, monitoring, evaluating, comparing, and/or similar terms used herein. In one embodiment, these functions, operations, and/or processes can be performed on data, content, information, and/or similar terms used herein. In this regard, the apparatus 200 embodies a particular, specially configured computing entity transformed to enable the specific operations described herein and provide the specific advantages associated therewith, as described herein.

Processor 202 or processor circuitry 202 may be embodied in a number of different ways. In various embodiments, the use of the terms "processor" should be understood to include a single core processor, a multi-core processor, multiple processors internal to the apparatus 200, and/or one or more remote or "cloud" processor(s) external to the apparatus 200. In some example embodiments, processor 202 may include one or more processing devices configured to perform independently. Alternatively, or additionally, processor 202 may include one or more processor(s) configured in tandem via a bus to enable independent execution of operations, instructions, pipelining, and/or multithreading.

In an example embodiment, the processor 202 may be configured to execute instructions stored in the memory 204 or otherwise accessible to the processor. Alternatively, or additionally, the processor 202 may be configured to execute hard-coded functionality. As such, whether configured by hardware or software methods, or by a combination thereof, processor 202 may represent an entity (e.g., physically embodied in circuitry) capable of performing operations according to embodiments of the present disclosure while configured accordingly. Alternatively, or additionally, processor 202 may be embodied as an executor of software instructions, and the instructions may specifically configure the processor 202 to perform the various algorithms embodied in one or more operations described herein when such instructions are executed. In some embodiments, the processor 202 includes hardware, software, firmware, and/or a combination thereof that performs one or more operations described herein.

In some embodiments, the processor 202 (and/or co-processor or any other processing circuitry assisting or otherwise associated with the processor) is/are in communication with the memory 204 via a bus for passing information among components of the apparatus 200.

Memory 204 or memory circuitry 204 may be non-transitory and may include, for example, one or more volatile and/or non-volatile memories. In some embodiments, the memory 204 includes or embodies an electronic storage device (e.g., a computer readable storage medium).

In some embodiments, the memory 204 is configured to store information, data, content, applications, instructions, or the like, for enabling an apparatus 200 to carry out various operations and/or functions in accordance with example embodiments of the present disclosure.

Input/output circuitry 206 may be included in the apparatus 200. In some embodiments, input/output circuitry 206 may provide output to the user and/or receive input from a user. The input/output circuitry 206 may be in communication with the processor 202 to provide such functionality. The input/output circuitry 206 may comprise one or more user interface(s). In some embodiments, a user interface may include a display that comprises the interface(s) rendered as a web user interface, an application user interface, a user device, a backend system, or the like. In some embodiments, the input/output circuitry 206 also includes a keyboard, a mouse, a joystick, a touch screen, touch areas, soft keys a microphone, a speaker, or other input/output mechanisms. The processor 202 and/or input/output circuitry 206 comprising the processor may be configured to control one or more operations and/or functions of one or more user interface elements through computer program instructions (e.g., software and/or firmware) stored on a memory accessible to the processor (e.g., memory 204, and/or the like). In some embodiments, the input/output circuitry 206 includes or utilizes a user-facing application to provide input/output functionality to a computing device and/or other display associated with a user.

Communications circuitry 208 may be included in the apparatus 200. The communications circuitry 208 may include any means such as a device or circuitry embodied in either hardware or a combination of hardware and software that is configured to receive and/or transmit data from/to a network and/or any other device, circuitry, or module in communication with the apparatus 200. In some embodiments the communications circuitry 208 includes, for example, a network interface for enabling communications with a wired or wireless communications network. Additionally or alternatively, the communications circuitry 208 may include one or more network interface card(s), antenna(s), bus(es), switch(es), router(s), modem(s), and supporting hardware, firmware, and/or software, or any other device suitable for enabling communications via one or more communications network(s). In some embodiments, the communications circuitry 208 may include circuitry for interacting with an antenna(s) and/or other hardware or software to cause transmission of signals via the antenna(s) and/or to handle receipt of signals received via the antenna(s). In some embodiments, the communications circuitry 208 enables transmission to and/or receipt of data from a user device, one or more sensors, and/or other external computing device(s) in communication with the apparatus 200.

Data intake circuitry 212 may be included in the apparatus 200. The data intake circuitry 212 may include hardware, software, firmware, and/or a combination thereof, designed and/or configured to capture, receive, request, and/or otherwise gather data associated with operations of one or more plant(s). In some embodiments, the data intake circuitry 212 includes hardware, software, firmware, and/or a combination thereof, that communicates with one or more sensor(s), unit(s), and/or the like within a particular plant to receive particular data associated with such operations of the plant 102. The data intake circuitry 212 may support such operations for any number of individual plants. Additionally or alternatively, in some embodiments, the data intake circuitry 212 includes hardware, software, firmware, and/or a combination thereof, that retrieves particular data associated with one more plant(s) from one or more data repository/repositories accessible to the apparatus 200.

AI and machine learning circuitry 210 may be included in the apparatus 200. The AI and machine learning circuitry 210 may include hardware, software, firmware, and/or a combination thereof designed and/or configured to request, receive, process, generate, and transmit data, data structures, control signals, and electronic information for training and executing a trained AI and machine learning model configured to facilitating the operations and/or functionalities described herein. For example, in some embodiments the AI and machine learning circuitry 210 includes hardware, software, firmware, and/or a combination thereof, that identifies training data and/or utilizes such training data for training a particular machine learning model, AI, and/or other model to generate particular output data based at least in part on learnings from the training data. Additionally or alternatively, in some embodiments, the AI and machine learning circuitry 210 includes hardware, software, firmware, and/or a combination thereof, that embodies or retrieves a trained machine learning model, AI and/or other specially configured model utilized to process inputted data. Additionally or alternatively, in some embodiments, the AI and machine learning circuitry 210 includes hardware, software, firmware, and/or a combination thereof that processes received data utilizing one or more algorithm(s), function(s), subroutine(s), and/or the like, in one or more pre-processing and/or subsequent operations that need not utilize a machine learning or AI model.

Data output circuitry 214 may be included in the apparatus 200. The data output circuitry 214 may include hardware, software, firmware, and/or a combination thereof, that configures and/or generates an output based at least in part on data processed by the apparatus 200. In some embodiments, the data output circuitry 214 includes hardware, software, firmware, and/or a combination thereof, that generates a particular report based at least in part on the processed data, for example where the report is generated based at least in part on a particular reporting protocol. Additionally or alternatively, in some embodiments, the data output circuitry 214 includes hardware, software, firmware, and/or a combination thereof, that configures a particular output data object, output data file, and/or user interface for storing, transmitting, and/or displaying. For example, in some embodiments, the data output circuitry 214 generates and/or specially configures a particular data output for transmission to another system sub-system for further processing. Additionally or alternatively, in some embodiments, the data output circuitry 214 includes hardware, software, firmware, and/or a combination thereof, that causes rendering of a specially configured user interface based at least in part on data received by and/or processing by the apparatus 200.

In some embodiments, two or more of the sets of circuitries 202-214 are combinable. Alternatively, or additionally, one or more of the sets of circuitry 202-214 perform some or all of the operations and/or functionality described herein as being associated with another circuitry. In some embodiments, two or more of the sets of circuitry 202-214 are combined into a single module embodied in hardware, software, firmware, and/or a combination thereof. For example, in some embodiments, one or more of the sets of circuitry, for example the AI and machine learning circuitry 210, may be combined with the processor 202, such that the processor 202 performs one or more of the operations described herein with respect the AI and machine learning circuitry 210.

With reference to FIGS. 1-4, in some embodiments, the operations processing system 140 and/or the user device 160 may be configured to receive operations data representing operations of the plant 102 (e.g., of the stack 104, the flame 110, etc.). In some embodiments, the operations data may include one or more of plant component identifiers, plant production capacity data, plant efficiency data, plant process data, flow rate data, temperature data, pressure data, volume data, venting data, oxygen input data, material composition data, and weather data. For example, the plant component identifiers may indicate whether the plant 102 has one or more well units, fracking units, crude processing units, hydrotreating units, isomerization units, vapor recovery units, catalytic cracking units, aromatics reduction units, visbreaker units, storage tank units, blender units, pump units, flash venting units, compressor units, cooler units (e.g., air cooler units), sensor units, flare units (e.g., the stack 104). As another example, the production capacity may indicate how much final product (e.g., refined oil) the plant 102 may be capable of producing (e.g., how much final product the plant 102 may be capable of producing within allowable safety limits). As another example, plant efficiency data may indicate the efficiency of one or more processes the plant 102 is performing. As another example, plant process data may indicate the process (e.g., the order of operations for one or more tasks) the plant 102 performs in order to produce a final product from one or more input ingredients. As another example, flow rate data may include the flow rate of various fluids in different locations throughout the plant (e.g., the flow rate of gas in the stack 104). As another example, the temperature data may indicate the temperature at various locations in the plant 102 (e.g., temperature in the stack 104) and/or the boiling point of various fluids in the plant 102. As another example, the pressure data may indicate the pressure (e.g., the pressure of gas in the stack 104) at various locations in the plant 102. As another example, the volume data may indicate the volume (e.g., fluid level in a storage tank) at various locations in the plant 102. As another example, the venting data may indicate whether the plant 102 is venting any gas (e.g., through the stack 104 without combusting the gas). As another example, the oxygen input data may indicate how much oxygen the plant 102 is mixing with the gas before the gas passes by the ignition source and/or simultaneously as the gas passes by the ignition source of the stack 104. As another example, the material composition data may indicate various properties of a final product the plant 102 is producing (e.g., refined oil) and/or input ingredients the plant 102 is using to produce the final product (e.g., unrefined oil), such as purity, density, viscosity, impurities, and/or the like. As another example, the weather data may indicate the weather around the plant 102 (e.g., the temperature around the plant 102, wind speed around the plant 102, humidity around the plant 102, precipitation around the plant 102, etc.).

In some embodiments, at least some of the operations data may be captured by the one or more sensor units of the plant 102, such as the one or more flow rate sensors, temperature sensors, pressure sensors, humidity sensors, image sensors, density sensors, material composition sensors (e.g., spectrometers, spectrophotometers, etc.), and/or the like. For example, the one or more flow rate sensors may be configured to capture one or more of flow rate data, pressure data, venting data, oxygen input data, and/or the like. As another example, the one or more temperature sensors may be configured to capture one or more of plant efficiency data, temperature data, weather data, and/or the like. As another example, the one or more pressure sensors may be configured to capture one or more of pressure data, venting data, volume data, weather data, and/or the like. As another example, the one or more humidity sensors may be configured to capture one or more of material composition data, weather data, and/or the like. As another example, the one or more image sensors may be configured to capture one or more of plant component identifiers, material composition data, volume data, venting data, weather data, and/or the like. As another example, the one or more density sensors may be configured to capture one or more of density data, volume data, and/or the like. As another example, the one or more material composition sensors may be configured to capture one or more of material composition data, volume data, and/or the like. Additionally or alternatively, in some embodiments, at least some of the operations data may be data that is not captured by the one or more sensor units of the plant 102. For example, operations data such as plant component identifiers, plant production capacity data, plant efficiency data, plant process data, and/or the like may be, for example, stored in a database at the plant 102 (e.g., operations that for which it may not be necessary for it to be captured by a sensor unit of the plant).

In some embodiments, the operations processing system 140 and/or the user device 160 may be configured to use the operations data to generate a simulation model 300, such as the simulation model 300 depicted in FIG. 3. In some embodiments, the simulation model 300 may be a computer model representation of the plant 102 based on the operations data. In this regard, for example, the simulation model may include one or more well components 302, fracking components 304, heater components 306, pump components 308, storage tank components 310, flash venting components 316, compressor components, cooler components 314, sensor components 320, flare components 318, weather components 322. In some embodiments, the components included in the simulation model 300 may be based on the operations data. For example, if the operations data includes a plant component identifier that indicates the plant 102 has a fracking component 304, the simulation model 300 may include a fracking component 304. As another example, if the operations data includes flow rate data, the simulation model 300 may include a sensor component 320 corresponding to a flow sensor. As another example, if the operations data indicates wind speed around the plant 102, the simulation model 300 may include a weather component 322 corresponding to the wind speed around the plant 102.

Although depicted as separate components of the simulation model 300, it would be understood by one skilled in the field to which this disclosure pertains that the some or all of the components may be combined with other components of the simulation model 300. For example, the well component 302 and the fracking component 304 may be combined into a single component. As another example, the venting component 316 and the flaring component 318 may be combined into a single component. Additionally, it would be understood by one skilled in the field to which this disclosure pertains that the simulation model 300 may have more or fewer components.

In some embodiments, the operations processing system 140 and/or the user device 160 may be configured to apply the simulation model 300 to determine a first flaring efficiency estimate. In this regard, after generating the simulation model 300, the operations processing system 140 and/or the user device 160 may be configured to execute the simulation model 300 to determine the first flaring efficiency estimate. For example, the first flaring efficiency estimate may indicate that the plant 102 (e.g., the stack 104, the flame 110, etc.) has a first flaring efficiency estimate of 90 percent.

In some embodiments, applying the simulation model 300 to determine the first flaring efficiency estimate may include the simulation model 300 determining one or more physical or chemical properties associated with the plant 102 that, in some embodiments, may not have been captured by the one or more sensor units of the plant 102 (e.g., the plant 102 does not have a sensor unit capable of capturing at least one of the one or more physical or chemical properties). For example, applying the simulation model 300 may determine one or more physical properties associated with the plant 102, such as one or more of a melting point associated with a product produced by the plant 102 and/or input ingredient used by the plant 102 and/or a molecular weight associated with a product produced by the plant 102 and/or input ingredient used by the plant 102 (e.g., a fluid in the plant 102). Additionally or alternatively, for example, applying the simulation model 300 may determine one or more chemical properties associated with the plant 102, such as one or more of a flammability associated with a product produced by the plant 102 and/or input ingredient used by the plant 102 (e.g., gas in the stack 104) and/or a pH value associated with a product produced by the plant 102 and/or input ingredient used by the plant 102 (e.g., a fluid in the plant 102). In some embodiments, the one or more physical or chemical properties determined by applying the simulation model 300 may be used by the simulation model 300 to, at least partially, determine the first flaring efficiency estimate (e.g., in addition to the received operations data).

In some embodiments, the operations processing system 140 and/or the user device 160 may be configured to receive captured image data of a flare flame associated with the plant 102 (e.g., the flame 110). In some embodiments, the captured image data may be received from the one or more cameras 120. In some embodiments, the captured image data may be received from the one or more cameras 120 in real-time. In some embodiments, the captured image data may be representative of a captured image and/or video of the stack 104 and/or the flame 110 (e.g., the flare flame), such as the captured image 402 in FIG. 4. In some embodiments, the captured image 402 may be one or more of a visible light image, infrared image, other spectral image, and/or the like.

In some embodiments, the operations processing system 140 and/or the user device 160 may be configured to analyze the captured image data to determine a second flaring efficiency estimate. For example, the operations processing system 140 and/or the user device 160 may analyze the captured image data to determine that the second flaring efficiency estimate is 95 percent.

In some embodiments, analyzing the captured image data may include applying an image recognition model to determine a flame tilt 404, a flame color 406, and/or a flame shape 408. In some embodiments, the image recognition model may be a machine learning model. In this regard, for example, the image recognition model may be implemented, compiled, and/or executed by AI and machine learning circuitry 210. In some embodiments, the image recognition model is trained based on a historical captured image dataset and/or historical operations data dataset (e.g., stored in the one or more databases 150). For example, the historical captured image dataset and/or the historical operations data dataset may be used to train the image recognition model based on flame color 406, flame tilt 404, and/or flame shape 408 (e.g., what flame colors indicate a high second flaring efficiency estimate).

In some embodiments, the second flaring efficiency estimate may be based on the flame tilt 404. For example, if the flame tilt 404 is approximately 0 (e.g., the flame 110 is approximately parallel to the stack 104), the second flaring efficiency estimate may be high (e.g., 90 percent or higher). As another example, if the flame tilt 404 is approximately 90 (e.g., the flame 110 is approximately perpendicular to the stack 104), the second flaring efficiency estimate may be low (e.g., 50 percent or less). In some embodiments, the flame tilt 404 may be based on the weather around the plant 102 (e.g., the wind speed around the plant 102, precipitation around the plant 102, humidity around the plant 102, temperature around the plant 102, and/or the like), the amount of oxygen mixed with the gas before or during combustion, the flow rate of the gas to the stack 104, and/or the like. In this regard, for example, the second flaring efficiency estimate may be impacted by the weather around the plant 102 (e.g., the wind speed around the plant 102, precipitation around the plant 102, humidity around the plant 102, temperature around the plant 102, and/or the like), the amount of oxygen mixed with the gas before or during combustion, the flow rate of the gas to the stack 104, and/or the like.

Additionally or alternatively, in some embodiments, the second flaring efficiency estimate may be based on the flame color 406. For example, if the flame color 406 is dark blue (e.g., indicating efficient combustion of the gas), the second flaring efficiency estimate may be high (e.g., 90 percent or higher). As another example, if the flame color 406 is approximately yellow (e.g., indicating inefficient combustion of the gas), the second flaring efficiency estimate may be low (e.g., 50 percent or less). In some embodiments, the flame color 406 may be based on the weather around the plant 102 (e.g., the wind speed around the plant 102, precipitation around the plant 102, humidity around the plant 102, temperature around the plant 102, and/or the like), the amount of oxygen mixed with the gas before or during combustion, the flow rate of the gas to the stack 104, and/or the like. In this regard, for example, the second flaring efficiency estimate may be impacted by the weather around the plant 102 (e.g., the wind speed around the plant 102, precipitation around the plant 102, humidity around the plant 102, temperature around the plant 102, and/or the like), the amount of oxygen mixed with the gas before or during combustion, the flow rate of the gas to the stack 104, and/or the like.

Additionally or alternatively, in some embodiments, the second flaring efficiency estimate may be based on the flame shape 408. For example, if the flame shape 408 is substantially regular (e.g., the flame 110 has smooth edges and/or is substantially cylindrical), the second flaring efficiency estimate may be high (e.g., 90 percent or higher). As another example, if the flame shape 408 is substantially irregular (e.g., the flame 110 has jagged edges and/or is not substantially cylindrical), the second flaring efficiency estimate may be low (e.g., 50 percent or less). In some embodiments, the flame shape 408 may be based on the weather around the plant 102 (e.g., the wind speed around the plant 102, precipitation around the plant 102, humidity around the plant 102, temperature around the plant 102, and/or the like), the amount of oxygen mixed with the gas before or during combustion, the flow rate of the gas to the stack 104, and/or the like. In this regard, for example, the second flaring efficiency estimate may be impacted by the weather around the plant 102 (e.g., the wind speed around the plant 102, precipitation around the plant 102, humidity around the plant 102, temperature around the plant 102, and/or the like), the amount of oxygen mixed with the gas before or during combustion, the flow rate of the gas to the stack 104, and/or the like.

In some embodiments, the operations processing system 140 and/or the user device 160 may be configured to determine a flaring efficiency estimate. In some embodiments, the flaring efficiency estimate may be based on at least one of the first flaring efficiency estimate and the second flaring efficiency estimate. For example, the flaring efficiency estimate may be an average of the first flaring efficiency estimate and the second flaring efficiency estimate. In this regard, for example, if the first flaring efficiency estimate is 90 percent and the second flaring efficiency estimate is 80 percent, the flaring efficiency estimate may be 85 percent. As another example, the flaring efficiency estimate may be a weighted average of the first flaring efficiency estimate and the second flaring efficiency estimate. In this regard, for example, if the first flaring efficiency estimate is 90 percent and the second flaring efficiency estimate is 80 percent, the flaring efficiency estimate may be 87.5 percent. In some embodiments, the flaring efficiency estimate may be a weighted average of the first flaring efficiency estimate and the second flaring efficiency estimate when the captured image data and/or the operations data indicates that either the first flaring efficiency estimate, or the second flaring efficiency estimate is likely to be more accurate. In this regard, for example, the second flaring efficiency estimate (e.g., based on the captured image data) may be less accurate when the operations data (e.g., the weather data) and/or the captured image data indicate that there is precipitation (e.g., it is raining) around the plant 102, because the precipitation may increase the difficulty of accurately analyzing the captured image data. Alternatively, the first flaring efficiency estimate (e.g., based on the captured image data) may be less accurate when the operations data (e.g., the weather data) and/or the captured image data indicate that there is not enough operations data to generate an accurate simulation model 300 (e.g., the operations data does not include any temperature data). As another example, the flaring efficiency estimate may be equal to the first flaring efficiency estimate (e.g., the second flaring efficiency estimate may be disregarded). In this regard, for example, if the first flaring efficiency estimate is 90 percent and the second flaring efficiency estimate is 60 percent, the flaring efficiency estimate may be 90 percent. In some embodiments, the flaring efficiency estimate may be equal to the first flaring efficiency estimate when the operations data and/or the captured image data indicate that the second flaring efficiency estimate may be inaccurate. In this regard, for example, the second flaring efficiency estimate (e.g., based on the captured image data) may be inaccurate when the operations data (e.g., the weather data) and/or the captured image data indicate that there is precipitation (e.g., it is raining) around the plant 102, because the precipitation may increase the difficulty of accurately analyzing the captured image data. As another example, the flaring efficiency estimate may be equal to the second flaring efficiency estimate (e.g., the first flaring efficiency estimate may be disregarded). In this regard, for example, if the first flaring efficiency estimate is 90 percent and the second flaring efficiency estimate is 60 percent, the flaring efficiency estimate may be 60 percent. In some embodiments, the flaring efficiency estimate may be equal to the second flaring efficiency estimate when the operations data and/or the captured image data indicate that the second flaring efficiency estimate may be inaccurate. In this regard, for example, the first flaring efficiency estimate (e.g., based on the operations data) when the operations data (e.g., the weather data) and/or the captured image data indicate that there is not enough operations data to generate an accurate simulation model 300 (e.g., the operations data does not include any flow rate data).

In some embodiments, after the operations processing system 140 and/or the user device 160 determine the flaring efficiency estimate, the operations processing system 140 and/or the user device 160 may be configured to provide (e.g., transmit) the plant 102 with the flaring efficiency estimate to the plant 102. In this regard, the plant 102 may be able to accurately track the amount of gas that the plant 102 is releasing into the atmosphere (e.g., to ensure the plant 102 is meeting sustainability regulations). Additionally or alternatively, the operations processing system 140 and/or the user device 160 may be configured to provide (e.g., transmit) the plant 102 with one or more recommended actions that the plant 102 can perform to improve the flaring efficiency of the plant 102. For example, the one or more recommended actions may include only flaring when the wind speed around the plant 102 is below a certain level, increasing the amount of oxygen that is mixed with the gas before the gas passes by the ignition source in the stack 104 (e.g., to better facilitate the burning of the gas), and/or decrease the flow rate of the gas in the stack 104 (e.g., to help ensure a large percentage of the gas is combusted when flared).

Example Method

Referring now to FIG. 5, a flowchart providing an example method 500 for determining a flaring efficiency estimate is illustrated. In this regard, FIG. 5 illustrates operations that may be performed by the operations processing system 140 and/or the user device 160, the plant 102, the stack 104, the flame 110, and/or the like. In some embodiments, the example method 500 defines a computer-implemented process, which may be executable by any of the device(s) and/or system(s) embodied in hardware, software, firmware, and/or a combination thereof, as described herein. In some embodiments, computer program code including one or more computer-coded instructions are stored to at least one non-transitory computer-readable storage medium, such that execution of the computer program code initiates performance of the method 500.

As shown in block 502, the method 500 for determining a flaring efficiency estimate may include receiving operations data representing operations of a plant. As described above, in some embodiments, the operations data may include one or more of plant component identifiers, plant production capacity data, plant efficiency data, plant process data, flow rate data, temperature data, pressure data, volume data, venting data, oxygen input data, density data, material composition data, and weather data. As described above, in some embodiments, the operations data may be captured by the one or more sensor units of the plant. In some embodiments, the one or more sensor units may include one or more flow rate sensors, temperature sensors, pressure sensors, humidity sensors, image sensors, density sensors, material composition sensors (e.g., spectrometers, spectrophotometers, etc.), and/or the like. As described above, in some embodiments, at least some of the operations data may be data that is not captured by the one or more sensor units of the plant. For example, operations data such as plant component identifiers, plant production capacity data, plant efficiency data, plant process data, and/or the like may be, for example, stored in a database at the plant (e.g., operations that for which it may not be necessary for it to be captured by a sensor unit of the plant).

As shown in block 504, the method 500 for determining a flaring efficiency estimate may include generating a simulation model of the plant based on the operations data. As described above, the simulation model may be a computer model representation of the plant based on the operations data. In this regard, for example, the simulation model may include one or more well components, fracking components, heater components, pump components, storage tank components, flash venting components, compressor components, cooler components, sensor components, flare components, weather components. In some embodiments, the components included in the simulation model may be based on the operations data.

As shown in block 506, the method 500 for determining a flaring efficiency estimate may include applying the simulation model of the plant to determine a first flaring efficiency estimate. As described above, in some embodiments, after generating the simulation model, the operations processing system and/or the user device may be configured to execute the simulation model to determine the first flaring efficiency estimate. For example, the first flaring efficiency estimate may indicate that the plant (e.g., the stack, the flame, etc.) has a first flaring efficiency estimate of 90 percent. As described above, in some embodiments, applying the simulation model to determine the first flaring efficiency estimate may include the simulation model determining one or more physical or chemical properties associated with the plant that, in some embodiments, may not have been captured by the one or more sensor units of the plant (e.g., the plant does not have a sensor unit capable of capturing at least one of the one or more physical or chemical properties).

As shown in block 508, the method 500 for determining a flaring efficiency estimate may include receiving captured image data of a flare flame associated with the plant. As described above, in some embodiments, the captured image data may be received from the camera. In some embodiments, the captured image data may be received from the camera in real-time. In some embodiments, the captured image data may be representative of a captured image and/or video of the stack and/or the flame (e.g., the flare flame).

As shown in block 510, the method 500 for determining a flaring efficiency estimate may include analyzing the captured image data to determine a second flaring efficiency estimate. As described above, in some embodiments, analyzing the captured image data may include applying an image recognition model to determine a flame tilt, a flame color, and/or a flame shape. In some embodiments, the image recognition model may be a machine learning model. In this regard, for example, the image recognition model may be implemented, compiled, and/or executed by AI and machine learning circuitry. In some embodiments, the image recognition model is trained based on a historical captured image dataset and/or historical operations data dataset (e.g., stored in the one or more databases). For example, the historical captured image dataset and/or the historical operations data dataset may be used to train the image recognition model based on flame color, flame tilt, and/or flame shape (e.g., what flame colors indicate a high second flaring efficiency estimate).

As shown in block 512, the method 500 for determining a flaring efficiency estimate may include determining the flaring efficiency estimate based on at least one of the first flaring efficiency estimate and the second flaring efficiency estimate. As described above, in some embodiments, the flaring efficiency estimate may be based on at least one of the first flaring efficiency estimate and the second flaring efficiency estimate. For example, the flaring efficiency estimate may be an average of the first flaring efficiency estimate and the second flaring efficiency estimate. As another example, the flaring efficiency estimate may be a weighted average of the first flaring efficiency estimate and the second flaring efficiency estimate. As another example, the flaring efficiency estimate may be equal to the first flaring efficiency estimate (e.g., the second flaring efficiency estimate may be disregarded). As another example, the flaring efficiency estimate may be equal to the second flaring efficiency estimate (e.g., the first flaring efficiency estimate may be disregarded).

As shown in block 514, the method 500 for determining a flaring efficiency estimate may optionally include transmitting the flaring efficiency estimate to the plant. As described above, in this regard the plant may be able to accurately track the amount of gas that the plant is releasing into the atmosphere (e.g., to ensure the plant is meeting sustainability regulations). Additionally or alternatively, transmitting the flaring efficiency estimate to the plant may include providing (e.g., transmitting) the plant with one or more recommended actions that the plant can perform to improve the flaring efficiency of the plant.

Operations and/or functions of the present disclosure have been described herein, such as in flowcharts. As will be appreciated, computer program instructions may be loaded onto a computer or other programmable apparatus (e.g., hardware) to produce a machine, such that the resulting computer or other programmable apparatus implements the operations and/or functions described in the flowchart blocks herein. These computer program instructions may also be stored in a computer-readable memory that may direct a computer, processor, or other programmable apparatus to operate and/or function in a particular manner, such that the instructions stored in the computer-readable memory produce an article of manufacture, the execution of which implements the operations and/or functions described in the flowchart blocks. The computer program instructions may also be loaded onto a computer, processor, or other programmable apparatus to cause a series of operations to be performed on the computer, processor, or other programmable apparatus to produce a computer-implemented process such that the instructions executed on the computer, processor, or other programmable apparatus provide operations for implementing the functions and/or operations specified in the flowchart blocks. The flowchart blocks support combinations of means for performing the specified operations and/or functions and combinations of operations and/or functions for performing the specified operations and/or functions. It will be understood that one or more blocks of the flowcharts, and combinations of blocks in the flowcharts, can be implemented by special purpose hardware-based computer systems which perform the specified operations and/or functions, or combinations of special purpose hardware with computer instructions.

While this specification contains many specific embodiments and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While operations and/or functions are illustrated in the drawings in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this specification contains many specific embodiment and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are illustrated in the drawings in a particular order, this should not be understood as requiring that such operations be performed in the particular order shown or in sequential order, or that all illustrated operations be performed, to achieve desirable results. In certain circumstances, operations in alternative ordering may be advantageous. In some cases, the actions recited in the claims may be performed in a different order and still achieve desirable results.

That which is claimed:

1. A computer-implemented method for determining a flaring efficiency estimate, the computer-implemented method comprising:
    receiving operations data representing operations of a plant;
    generating a simulation model of the plant based at least in part on the operations data;
    applying the simulation model of the plant to determine a first flaring efficiency estimate;
    receiving captured image data of a flare flame associated with the plant;
    analyzing the captured image data to determine a second flaring efficiency estimate; and
    determining the flaring efficiency estimate based on at least one of the first flaring efficiency estimate and the second flaring efficiency estimate.

2. The computer-implemented method of claim 1, wherein the operations data comprises one or more of plant component identifiers, plant production capacity data, plant efficiency data, plant process data, flow rate data, temperature data, pressure data, volume data, venting data, oxygen input data, density data, material composition data, and weather data.

3. The computer-implemented method of claim 1, wherein the operations data representing operations of the plant is received in real-time.

4. The computer-implemented method of claim 1, wherein the simulation model comprises one or more well components, fracking components, heater components, pump components, storage tank components, flash venting components, compressor components, cooler components, sensor components, and flare components.

5. The computer-implemented method of claim 1, wherein the flaring efficiency estimate is an average of the first flaring efficiency estimate and the second flaring efficiency estimate.

6. The computer-implemented method of claim 1, wherein the flaring efficiency estimate is equal to the first flaring efficiency estimate.

7. The computer-implemented method of claim 6, wherein the flaring efficiency estimate is equal to the first flaring efficiency estimate when the operations data indicates that the second flaring efficiency estimate is inaccurate.

8. The computer-implemented method of claim 1, wherein analyzing the captured image data comprises:
   applying an image recognition model to analyze the captured image data to determine one or more of a flame tilt, a flame color, and a flame shape.

9. The computer-implemented method of claim 8, wherein the second flaring efficiency estimate is determined based at least in part on one or more of the flame tilt, the flame color, and the flame shape.

10. The computer-implemented method of claim 8, wherein the image recognition model is a machine learning model trained on a historical captured image dataset and a historical operations data dataset.

11. An apparatus for determining a flaring efficiency estimate, the apparatus comprising at least one processor and at least one memory coupled to the at least one processor, wherein the at least one processor is configured to:
   receive operations data representing operations of a plant;
   generate a simulation model of the plant based at least in part on the operations data;
   apply the simulation model of the plant to determine a first flaring efficiency estimate;
   receive captured image data of a flare flame associated with the plant;
   analyze the captured image data to determine a second flaring efficiency estimate; and
   determine the flaring efficiency estimate based on at least one of the first flaring efficiency estimate and the second flaring efficiency estimate.

12. The apparatus of claim 11, wherein the operations data comprises one or more of plant component identifiers, plant production capacity data, plant efficiency data, plant process data, flow rate data, temperature data, pressure data, volume data, venting data, oxygen input data, density data, material composition data, and weather data.

13. The apparatus of claim 11, wherein the simulation model comprises one or more well components, fracking components, heater components, pump components, storage tank components, flash venting components, compressor components, cooler components, sensor components, and flare components.

14. The apparatus of claim 11, wherein the flaring efficiency estimate is an average of the first flaring efficiency estimate and the second flaring efficiency estimate.

15. The apparatus of claim 11, wherein the flaring efficiency estimate is equal to the first flaring efficiency estimate.

16. The apparatus of claim 15, wherein the flaring efficiency estimate is equal to the first flaring efficiency estimate when the operations data indicates that the second flaring efficiency estimate is inaccurate.

17. The apparatus of claim 11, wherein analyzing the captured image data comprises the at least one processor being configured to:
   apply an image recognition model to analyze the captured image data to determine one or more of a flame tilt, a flame color, and a flame shape.

18. The apparatus of claim 17, wherein the second flaring efficiency estimate is determined based at least in part on one or more of the flame tilt, the flame color, and the flame shape.

19. The apparatus of claim 17, wherein the image recognition model is a machine learning model trained on a historical captured image dataset and a historical operations data dataset.

20. A non-transitory computer-readable storage medium for determining a flaring efficiency estimate comprising computer program code for execution by one or more processors of a device, the computer program code configured to, when executed by the one or more processors, cause the device to:
   receive operations data representing operations of a plant;
   generate a simulation model of the plant based at least in part on the operations data;
   apply the simulation model of the plant to determine a first flaring efficiency estimate;
   receive captured image data of a flare flame associated with the plant;
   analyze the captured image data to determine a second flaring efficiency estimate; and
   determine the flaring efficiency estimate based on at least one of the first flaring efficiency estimate and the second flaring efficiency estimate.

* * * * *